(12) United States Patent
Cattet et al.

(10) Patent No.: US 8,247,309 B2
(45) Date of Patent: Aug. 21, 2012

(54) CONTROLLED TEMPERATURE IMPLANTATION

(75) Inventors: Sébastien Cattet, Domene (FR); Guillaume Cattet-Guerrini, legal representative, Montfavet (FR); Lise Guerrini, legal representative, Montfavet (FR); Nadia Ben Mohamed, Echirolles (FR); Benjamin Scarfogliere, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 12/599,680

(22) PCT Filed: Mar. 26, 2009

(86) PCT No.: PCT/EP2009/053579
§ 371 (c)(1), (2), (4) Date: Jan. 13, 2011

(87) PCT Pub. No.: WO2009/118374
PCT Pub. Date: Oct. 1, 2009

(65) Prior Publication Data
US 2011/0312156 A1    Dec. 22, 2011

(30) Foreign Application Priority Data
Mar. 28, 2008 (FR) .................... 08 52014

(51) Int. Cl.
*H01L 21/46* (2006.01)
(52) U.S. Cl. .............. 438/458; 257/E21.568
(58) Field of Classification Search ........... 438/458, 438/459; 257/E21.568; 427/8, 9; 216/62, 216/87
See application file for complete search history.

(56) References Cited

U.S. PATENT DOCUMENTS

| | | | |
|---|---|---|---|
| 5,374,564 A | 12/1994 | Bruel | 437/24 |
| 5,877,070 A | 3/1999 | Goesele et al. | 438/458 |
| 6,150,239 A | 11/2000 | Goesele et al. | 438/458 |
| 6,312,797 B1 | 11/2001 | Yokokawa et al. | 428/336 |
| 6,696,352 B1 | 2/2004 | Carr et al. | 438/458 |
| 7,148,124 B1 | 12/2006 | Usenko | 438/458 |
| 2002/0157790 A1 | 10/2002 | Abe et al. | 156/334 |
| 2003/0087504 A1* | 5/2003 | Erokhin et al. | 438/407 |
| 2005/0191827 A1* | 9/2005 | Collins et al. | 438/513 |
| 2007/0259511 A1 | 11/2007 | Murrell et al. | 438/535 |
| 2008/0311686 A1* | 12/2008 | Morral et al. | 438/7 |
| 2009/0232981 A1* | 9/2009 | Blake et al. | 427/243 |

FOREIGN PATENT DOCUMENTS

| | | |
|---|---|---|
| EP | 0 971 396 | 1/2000 |
| EP | 1 189 285 | 3/2002 |
| WO | WO 2007/019277 | 2/2007 |

OTHER PUBLICATIONS

International Search Report, PCT/EP2009/053579, mailed May 14, 2009.

(Continued)

*Primary Examiner* — William D Coleman
*Assistant Examiner* — Christine Enad
(74) *Attorney, Agent, or Firm* — Winston & Strawn LLP

(57) ABSTRACT

In order to reduce and render uniform the surface roughness and variations in thickness of a layer after detachment (post-fracture) of a donor substrate, the mean temperature of the donor substrate during implantation thereof is controlled so as to be in the range 20° C. to 150° C. with a maximum temperature variation of less than 30° C.

14 Claims, 2 Drawing Sheets

OTHER PUBLICATIONS

Zhineng Fan et al., "Thickness Uniformity of Silicon-on-Insulator Fabricated by Plasma Immersion Ion Implantation and Ion Cut", IEEE Transactions on Plasma Science, vol. 27, No. 2, p. 633 (1999).

Auberton-Hervé et al., "Why Can Smart-Cut Change the Future of Microelectronics?" International Journal of High Speed Electronics and Systems 10(1): 131-146 (2000).

* cited by examiner

CONTROLLED TEMPERATURE IMPLANTATION

This application is a 371 filing of International Patent Application PCT/EP2009/053579 filed Mar. 26, 2009.

TECHNICAL FIELD AND PRIOR ART

The present invention relates to a method of producing SOI (silicon on insulator) or SeOI (semiconductor on insulator) type structures by layer transfer using the SmartCut™ technique. An example of an implementation of the SmartCut™ technique is described in particular in the document U.S. Pat. No. 5,374,564 or in the article by A. J. Auberton-Hervé et al entitled "Why can SmartCut™ change the future of microelectronics?", Int Journal of High Speed Electronics and Systems, vol 10, no 1, 2000, p 131-146. That technique employs the following steps:

a) bombarding one face of a donor substrate (of silicon, for example) with light ions of the hydrogen or rare gas type (for example hydrogen and/or helium) to implant those ions in sufficient concentration into the substrate, the implanted zone producing a layer of weakness by the formation of microcavities or platelets;

b) bringing said face of the donor substrate into intimate contact (bonding) with a receiving substrate; and c) cleaving/fracturing the donor substrate at the implanted zone in order to transfer onto the receiving substrate the portion of the substrate that is located between the surface that undergoes implantation and the implantation zone in order to obtain a SOI type structure resulting from transfer of the layer from the donor substrate onto the receiving substrate.

However, after such a transfer, both the transferred layer and the donor substrate exhibit surface roughness.

Document U.S. Pat. No. 6,150,239 describes a method of fabricating a SOI type substrate which, in a variation, comprises the following steps:

implanting a source substrate, carried out at a temperature that is higher than the later fracture temperature of the substrate;

bonding that source substrate onto a receiving substrate and fracturing at the implanted zone by means of splitting annealing.

That document states that the thickness of the damaged zone and the post-fracture roughness may be reduced if implantation is carried out at a temperature higher than 450° C.

Further, it is also known to cool wafers that are being subjected to implantation to below 50° C. Typically, in an implanter (implantation device), the wafers are positioned on a support. There are two types of support.

The first type of support is found in "batch" type implanters in which the wafers are positioned and implanted in batches. In this "collective" type of implantation, the wafers are positioned along a perimeter of a large wheel that is driven in rotation. The wafers are thus held on the supports by centrifugal force.

The second type of support is used with individual "single wafer" type implanters in which the wafers are positioned and implanted individually and in succession. The support (termed a "chuck" in a single wafer implanter) typically has projecting elements (islets) on which the wafers rest locally. The wafers are held on the chuck by electrostatic force—whence the term "electrostatic chuck" (ESC).

During implantation, the stream of the implanted species tends to heat up the wafer. In known manner, the wafer may be cooled during implantation by circulating a cooling liquid in the wafer support. Further, in a single wafer implanter, a gas may be introduced between the wafer and the chuck to provide optimum thermal conductivity between those two elements and thereby further improve cooling of the wafer.

However, even with cooling of the wafer during implantation thereof, the improvement in the surface roughness and the uniformity of thickness of the transferred layer is still limited. However, when using the SmartCut™ technique (implantation+fracture), it is important to be able to produce wafers that have as low a surface roughness as possible and that are as homogeneous as possible. It is also important to minimize variations in the uniformity of the thickness of the transferred layer.

SUMMARY OF THE INVENTION

The object of the present invention is to provide a solution that can reduce and render uniform both surface roughness after detachment (post-fracture) and variations in the thickness of the transferred layer.

To this end, the invention provides a method of transferring a layer from a donor substrate formed from a semiconductor material, such as silicon, for example, onto a receiving substrate, the method comprising:

a) a step of ionic implantation carried out by bombarding the front face of a donor substrate with a beam of ions to form, at a predetermined depth in the substrate, a layer of microcavities or platelets defining the layer to be transferred in the upper portion of the substrate;

b) a step of bonding the front face of the donor substrate with one face of the receiving substrate; and c) a step of detachment by splitting at the layer of microcavities or platelets formed in the donor substrate in order to transfer the layer detached from the donor substrate onto the receiving substrate;

the method being characterized in that during step a), the donor substrate is maintained at a mean temperature in the range 20° C. to 150° C. with a maximum temperature variation of less than 30° C.

Thus, as is explained below in detail, by maintaining the temperature of the donor substrate within these values, both the degree of roughness and the uniformity of thickness of the transferred layer are significantly improved.

In accordance with one aspect of the invention, the mean temperature range of 20° C. to 150° C. with a maximum temperature variation of less than 30° C. may be obtained by adjusting the power of the ion beam during the implantation step to a value of 500 watts (W) or less, preferably 300 W or less.

In accordance with another aspect of the invention, during step a), the donor substrate is held by a support that is capable of diffusing a cooling gas over the backside of the donor substrate, said cooling gas being maintained at a predetermined pressure.

The cooling gas is preferably a gas with a high heat transfer coefficient, such as helium or hydrogen.

The cooling gas may be diffused towards the center of the backside of the donor substrate.

In order to improve the uniformity of cooling of the substrate, the cooling gas may also be diffused towards the periphery of the backside of the donor substrate.

In accordance with another aspect of the invention, during step a), the support may also comprise a circuit in which a cooling liquid is circulated at a temperature in the range 8° C. to 45° C.

In accordance with yet another aspect of the invention, the surface of the support facing the backside of the donor substrate between which surfaces the cooling gas circulates is planar, i.e. it does not comprise any channel, groove, track or other shape that might modify the uniformity of cooling obtained by the gas. In this manner, spatial variations in the temperature of the substrate during implantation are reduced.

The donor substrate is a semiconductor material such as silicon, germanium, or silicon-germanium.

BRIEF DESCRIPTION OF THE FIGURES

The characteristics and advantages of the present invention become apparent from the following description made by way of non-limiting illustration with reference to the accompanying drawings in which.

DETAILED DESCRIPTION OF IMPLEMENTATIONS OF THE INVENTION

Figure 1:
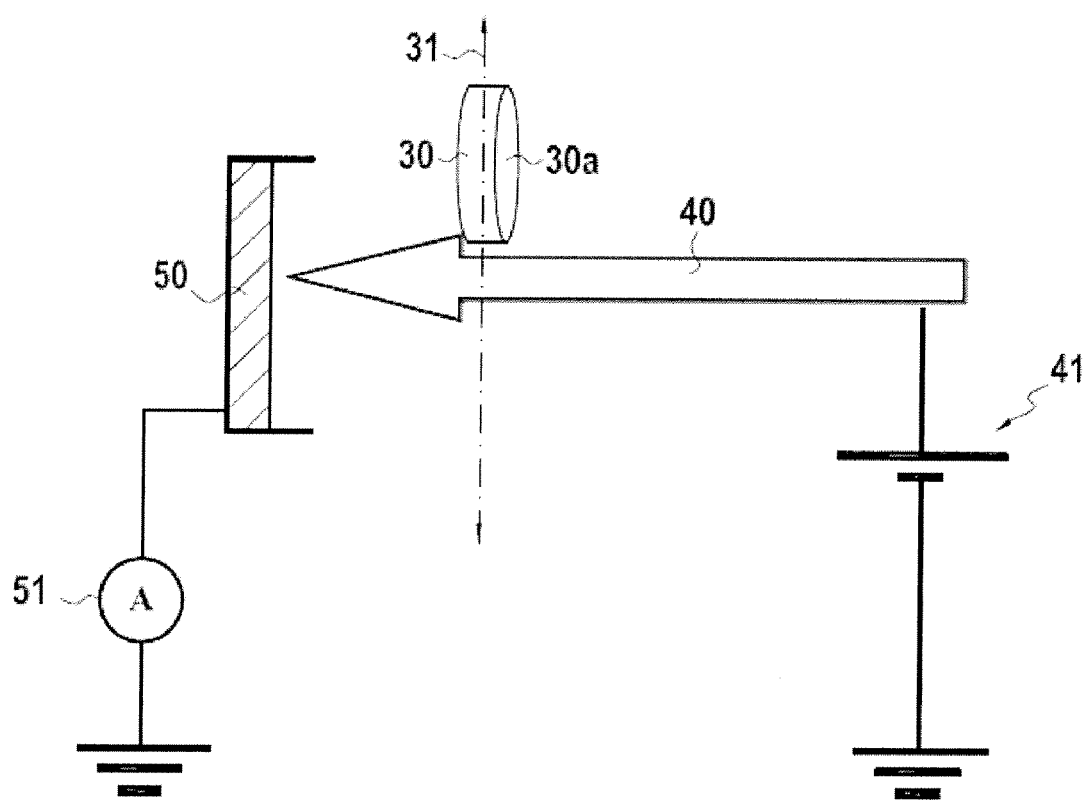
FIG. 1 is a simplified diagram showing a device for measuring the current of the ion beam used in an implanter.

The present invention is applicable to any layer transfer method that, as in the SmartCut™ technique, makes use of at least one implantation step of implanting ions in a donor substrate to define a layer that is to be transferred by means of a plane of weakness, a bonding step of bonding the implanted donor substrate on a receiving substrate, and an application step of applying a detachment stress that may consist in applying heat treatment (splitting anneal) and/or a mechanical detachment stress such as inserting a blade at the layer at which the implanted ions are concentrated and/or applying tensile stresses and/or applying ultrasound or microwaves of appropriate power and frequency.

The donor substrate or wafer is in the form of a thin section of a semiconductor material such as silicon, for example.

Ion implantation is carried out with equipment or implantation apparatus that are well known and that principally comprise an ion beam generator and an implantation chamber in which the semiconductor wafer is bombarded with the ion beam emitted from a fixed position in the chamber. In general, the wafer is mounted on a mobile support in order to allow the whole surface thereof to be scanned by the ion beam and/or to scan several wafers in succession.

The principle of the invention consists in reducing the mean temperature and spatial temperature variations present in the wafer constituting the donor substrate while ions are being implanted therein, which has the effect of reducing and rendering uniform both surface roughness after splitting and variations in the thickness of the transferred layer.

However, known cooling means have limited effectiveness as regards improving the roughness and the uniformity of the transferred layer. In fact, while those cooling means can reduce the temperature overall, the Applicant has observed that the temperature is not uniform at the wafer surface. In particular, the presence of cavities between the support and the wafer when the wafer does not rest directly on the support but rather on projecting elements such as islets, results in local increases in the temperature at these cavities. The Applicant has established that there exists a relationship between firstly the uniformity of the temperature, and secondly the roughness and the uniformity of thickness of the transferred layer. The Applicant has observed that:

the thickness of the transferred layer is dependent on the temperature of the wafer during implantation. Thus, a lack of homogeneity in the temperature of the implanted wafer results in a lack of homogeneity (spatial fluctuations) in the thickness of the transferred layer;

the roughness after a first finishing step (RTA) of the transferred surface is also dependent on the temperature of the implanted wafer. Thus, a lack of homogeneity in the temperature of the implanted wafer also results in a lack of homogeneity (spatial fluctuations) in the roughness of the transferred layer.

More precisely, the Applicant has determined that if the temperature of the wafer during implantation is maintained at a mean temperature in the range 20° C. to 150° C. with a maximum temperature variation of 30° C. between the hottest point and the coldest point of the wafer (radial variation measured at the wafer surface), the roughness and the uniformity of thickness of the transferred layer are significantly improved. In accordance with the invention, the temperature of the donor substrate while ions are being implanted therein may be controlled in several ways.

A first means consists of reducing the power of the ion beam used to bombard the front face of the donor substrate. During implantation, the ion bean received by a wafer tends to heat the wafer up.

The more intense the beam, the greater the risk that the wafer will heat up because of the power being transmitted to the wafer. The power P is defined as the product of the implantation current I multiplied by the acceleration voltage U, i.e. P=UI.

As a result, it can be seen that if the power of the ion beam is reduced, the heating in the wafer caused by the ion beam is moderated. In accordance with the present invention, the power of the ion beam may be limited to 500 W, which avoids heating the implanted substrate beyond a mean temperature of 150° C. In order to further reduce the mean temperature of the substrate during implantation, in particular to a mean temperature in the range 20° C. to 150° C., the power of the ion beam needs to be reduced to a value below the limiting value indicated above, for example to a limiting value of 300 W.

There is a relationship between the value of the power of the ion beam and the temperature to which the wafer is heated that may in particular be expressed by the following simplified formula:

$$\Delta T_S(t) = 2 \frac{P_B}{A_B} \sqrt{\frac{t}{\pi k \rho C_p}}$$

in which:

$\Delta T_S(t)$ is the temperature variation;

$P_B$ is the power of the beam as defined above, namely the product of the current of the beam multiplied by the acceleration voltage;

$A_B$ is the total surface area scanned by the beam;

k is the thermal conductivity of the wafer;

ρ is the density of the wafer; and $C_p$ is the specific heat.

The power of the ion beam in the implanter is controlled by measuring the electric flux generated by the ion beam during implantation. FIG. 1 shows a simplified diagram of an implanter equipped with means for measuring the current of the ion beam. As can be seen in FIG. 1, during implantation, the face 30a of a wafer 30 of semiconductor material is subjected to ion bombardment by displacing the wafer 30 along a displacement axis 31 past a fixed ion beam 40. In known manner, the ion beam 40 is generated from an ion source (not shown in FIG. 1) supplied by a high voltage generator 41.

The current of the ion beam is measured using a beamstop or Faraday measuring apparatus that is generally constituted by a graphite disk 50 that receives the ion beam 40, the disk 50 being connected to an ammeter 51. Since the ion beam 40 is constituted by electrically charged ions (for example $H^+$ ions), the electric flux flowing via the graphite disk 50 to ground is equal to the flow of ions supplied by the beam 40. As a result, the ammeter 51 directly measures the current of the ion beam 40. An implanter provided with such a beam current measuring means is described in particular in document US-2007/0259511.

In accordance with the present invention, the measurement of the current of the beam produced is used to adjust the power of the ion beam in order to limit it to a predetermined limiting value (500 W or less).

The value of the acceleration voltage the implanter is adjusted directly. Thus, knowing the value of both the acceleration voltage and the value of the current of the ion beam, it is possible to calculate the power of the ion beam at any time during implantation and to control it or adjust it by acting on the ion beam current (P=UI).

The power of the ion beam can be controlled by using a regulation loop that delivers a voltage and/or current control signal to the generator 41 that is calculated as a function of a predetermined reference power and the power determined at the outlet on the basis of the beamstop current measurement and of the acceleration voltage value.

The generator voltage value may be imposed by the desired depth of the implantation peak that determines the mean thickness of the transferred layer. Under such circumstances, the power is regulated using only the implantation current.

The present invention also proposes other means for reducing the mean temperature and the temperature differences in the substrate during implantation thereof. These other means that are described below may in particular be used in combination with reducing the power of the ion beam, in particular to prevent the implantation period from increasing too much. The implantation dose is defined by the fluence "f" and corresponds to the total number of ions implanted per unit surface area in accordance with the formula:

$$f = \frac{I \times t}{q \times A}$$

in which:
I: the current of the ion beam;
t: the implantation period;
q: the charge of the electron; and
A: the implantation surface area.

If the power is reduced by reducing the current of the ion beam, the implantation period must be increased to keep the same total number of implanted ions. As a consequence, by using one or more means that can reduce the mean temperature and the temperature differences in the substrate during implantation, and reducing the implantation current is no longer the only factor for reducing heating of the substrate, with the result that this current may be maintained at values that do not cause too great an increase in the implantation period.

Among these other cooling means, the invention proposes using a cooling gas.

Figure 2:
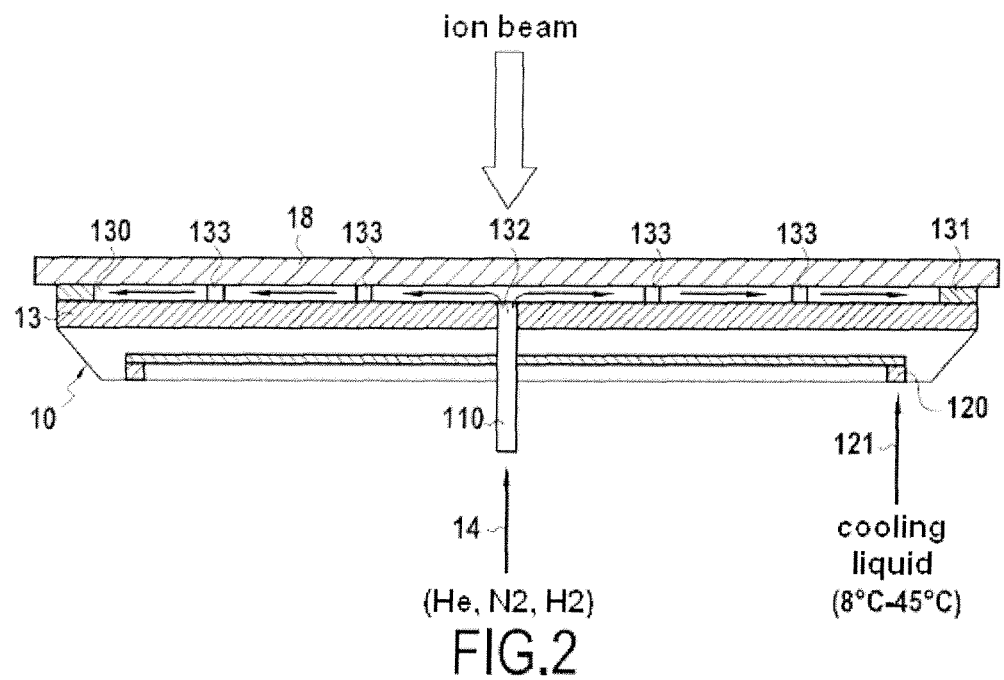
FIG. 2 is a diagrammatic sectional view of a wafer support device for implantation in accordance with one implementation of the invention.

FIG. 2 shows an embodiment of a wafer support device 10 that can retain and position a wafer during ion implantation. The support device 10 comprises a circular platen 13 on which a wafer 18 to be processed is disposed. The wafer 18 is held by an electrostatic force generated by the platen 13. The platen 13 includes a circular gasket 131 on which the wafer 18 rests, a recess 130 thus being provided between the wafer 18 and the platen 13. The center of the platen 13 includes an inlet 132 connected to a line 110 for introducing cooling gas 14. The support may also include small islets or spacers 133 disposed on the planar surface of said support facing the backside of the wafer 18. The islets 133, however, are as small as possible so that they do not disturb the circulation of the cooling gas and, as a result, the uniformity of temperature of the wafer.

The gas is introduced to the center of the platen and evacuated partially via the edges due to the partial seal between the wafer 18 and the platen 13. This partial seal may in particular be attained using a porous circular gasket 131, i.e. a gasket that has a certain degree of permeability to the cooling gas 14. Circulation of gas is not actually desirable but is imposed by ESC technology.

In accordance with one aspect of the invention, the cooling gas is preferably a gas having a high heat transfer coefficient, such as helium or hydrogen, which means that better heat transfer is obtained between the wafer and the support, and as a result the overall temperature is lower and more uniform than with nitrogen, for example.

A further improvement in rendering the temperature of the wafer spatially uniform may be attained by maintaining the cooling gas at a predetermined pressure in the recess 130. By controlling the pressure of the cooling gas in the recess 130, i.e. between the backside of the wafer 18 and the support 13, it is possible to have a predetermined quantity of cooling gas between the wafer and the support and to have better control, as regards level and uniformity, of the cooling temperature of the wafer. Once the pressure is in equilibrium, a small supply flow is sufficient to compensate for losses at the wafer edge in order to keep the pressure constant.

With a cooling gas that is directed onto the center of the backside of the wafer, the Applicant has observed that during implantation the wafer may have a radial temperature gradient between the center (coldest zone) and the edge of the wafer (hottest zone). The Applicant has also measured the roughness and thickness of the wafer and has observed that the roughness and uniformity of the thickness of the transferred layer also varies from the center to the edge of the wafer, which thus demonstrates the influence of radial temperature variation on the roughness and thickness of the layer.

In order to reduce the radial temperature gradient, the support is heated to a temperature that is preferably higher than that normally used (typically by approximately 8° C.) to cool the wafers during implantation. To this end, and as shown in FIG. 2, the support device 10 also comprises a circuit 120 that can circulate a cooling fluid 121 and maintain the support device, and more particularly the platen 13, at a predetermined temperature.

In the present invention, when the cooling gas is diffused to the center of the wafer, the support is preferably maintained at a temperature of approximately 45° C. by circulating cooling fluid 121 in the circuit 120, which means that the temperature gradient between the center and the edge of the wafer can be reduced. Clearly, if the only means for rendering the temperature of the wafer uniform is the support heated to 45° C., without any other means such as reducing the current of the beam mentioned above, the mean temperature of the wafer cannot drop below that temperature.

Figure 3:
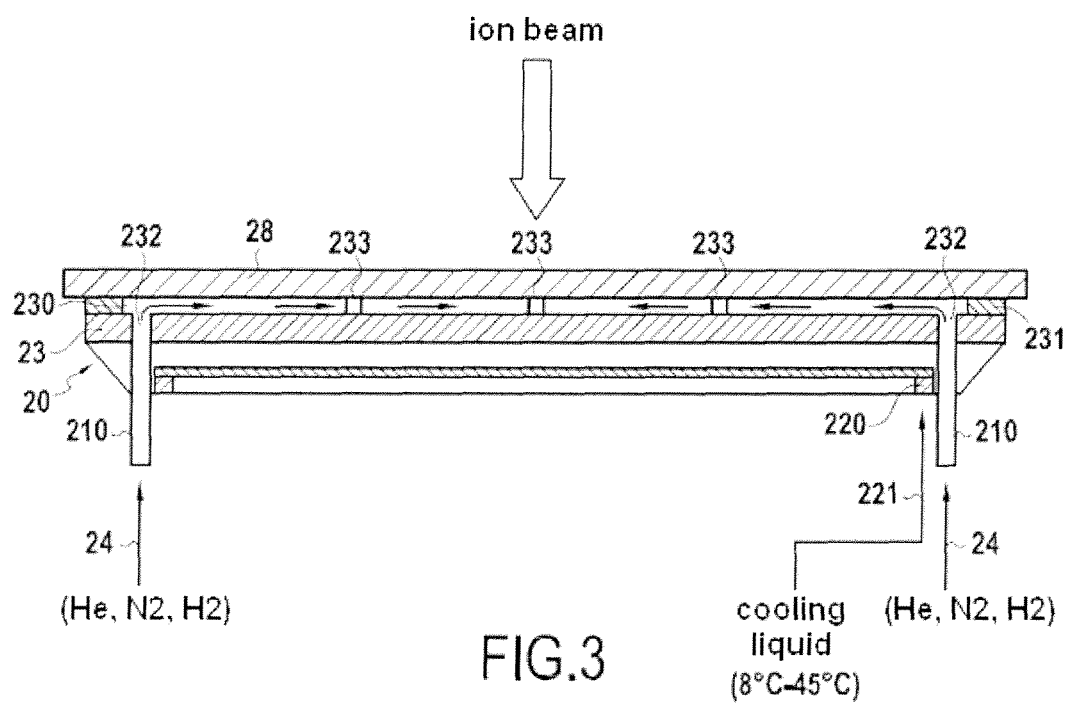
FIG. 3 is a diagrammatic sectional view of a wafer support device for implantation in accordance with another implementation of the invention.

FIG. 3 illustrates another embodiment of a wafer support device 20 that differs from that shown in FIG. 2 in that it can diffuse the cooling gas not from the center of the wafer but from the periphery thereof.

Like the support device of FIG. 2, the device 20 comprises a circular platen 23 holding a wafer 28 by electrostatic force, a circular gasket 231 (slightly permeable to cooling gas) being disposed between the wafer and the platen to produce a recess 230 that allows a cooling gas 24 to be introduced and circulated between the backside of the wafer 28 and the platen 23. In order to allow diffusion of the cooling gas, inlet orifices 232 for the cooling gas 24 are disposed in an annular manner close to the internal periphery of the gasket 231. The inlet orifices 232 are connected to lines 210 for introducing cooling gas. The support may also include small islets or spacers 233 disposed on the planar surface of said support facing the backside of the wafer 28.

Thus, as shown in FIG. 3, the cooling gas 24 is diffused inside the recess 230 via the inlet orifices 232, i.e. close to the edge of the wafer 28. As with the support of FIG. 2, a portion of the gas escapes at the periphery. Introducing gas at the periphery of the wafer locally compensates for the pressure drop due to leaks via the edge. This can improve the cooling achieved over the wafer as a whole.

As with the wafer support device presented in FIG. 2, the cooling gas is preferably a gas having a high thermal transfer coefficient, such as helium or hydrogen. Further, the cooling gas may also be maintained at a predetermined pressure in the recess 130, 230 in order to have a predetermined quantity of cooling gas between the wafer and the support and to improve control of the level and uniformity of the temperature of the wafer.

In accordance with yet another aspect of the invention, the Applicant has observed that the structure of the wafer support has an influence on the uniformity of the temperature of the wafer in relation to the uniformity of the roughness and the thickness of the transferred layer. Thus, with a support comprising gas circulation channels, for example, it has been observed that the zones of the wafer located above those channels are at a lower temperature than the remainder of the wafer. As a consequence, the roughness and uniformity of thickness of the transferred layer differ in those zones.

Thus, in addition, in accordance with the invention, the wafer is held on a support device comprising a platen that is free of any channel, groove, track, etc., for circulation of gas and in which the surface facing the backside of the wafer is planar. With such a planar surface, the stream of cooling gas circulating between the backside of the wafer and the support is more homogeneous, which means that temperature differences can be minimized. In this manner, the recess in which the cooling gas circulates between the wafer and the support can ensure substantially constant heat transfer between the wafer and the support.

In accordance with the invention, by cooling the wafer during implantation so as to maintain its mean temperature in the range 20° C. to 150° C., its roughness is significantly improved. Preferably, the mean temperature of the wafer is maintained in the range 50° C. to 80° C., or even in the range 60° C. to 70° C. The Applicant has observed that in these temperature ranges, the transferred layer has a minimum roughness. More precisely, after transfer of a layer of semiconductor material (silicon, germanium, SiGe, etc) from an implanted and split donor substrate or wafer, and after a smoothing or finishing step, the transfer method of the present invention can improve the uniformity of thickness of the transferred layer and reduce and render uniform its post-fracture surface roughness. As is well known, ion implantation may be carried out with a single species or with a plurality of species (co-implantation). Controlling the mean temperature of the wafer during implantation in accordance with the invention provides additional advantages when the wafer or the donor substrate is weakened by co-implantation of species such as, for example, co-implantation of hydrogen and helium.

The invention claimed is:

1. A method of reducing surface roughness and improving thickness uniformity in a transfer layer that is transferred from a donor substrate of semiconductor material onto a receiving substrate, which method comprises:
   disposing the donor substrate on a circular gasket held by a platen so as to define an enclosed recess between a backside of the substrate and the platen, the circular gasket forming a partial seal between the substrate and the platen;
   implanting ions by bombarding a front face of a donor substrate with an ion beam to form, at a predetermined depth in the donor substrate, a layer of weakness that includes microcavities or platelets and that defines the transfer layer between layer of weakness and the front face;
   during the implanting, diffusing a cooling gas into the recess and across the backside of the donor substrate, the cooling gas escaping the recess through the partial seal;
   bonding the front face of the donor substrate to a face of the receiving substrate; and
   detaching the transfer layer by splitting the microcavities or platelets at the layer of weakness in the donor substrate in order to transfer the layer to the receiving substrate;
   wherein the gasket enables the cooling gas to better maintain the donor substrate at a mean temperature in the range 20° C. to 150° C. with a maximum temperature variation of less than 30° C. during the implanting to reduce surface roughness and improve thickness uniformity of the transfer layer.

2. The method of claim 1, which further comprises, during the implanting
   measuring the ion beam current; and
   adjusting the ion beam in dependence on the measured current so that it has 500 W or less of power.

3. The method of claim 2 wherein the ion beam is adjusted in dependence on the ion beam measured current so that it has 300 W or less of power.

4. The method of claim 1, wherein the donor substrate, the gasket and the platen are held by a support device that assists in diffusing the cooling gas over the backside of the donor substrate and that maintains the cooling gas at a predetermined pressure.

5. The method of claim 4, wherein the cooling gas is diffused towards from the periphery to a center of the backside of the donor substrate.

6. The method of claim 4, wherein the support device has a planar surface facing the backside of the platen.

7. The method of claim 4, which further comprises circulating a fluid through a circuit in the support device to heat the support device to a predetermined temperature in order to reduce radial temperature gradients in the substrate.

8. The method of claim 1, wherein the cooling gas is selected from helium or hydrogen.

9. The method of claim 1, wherein the donor substrate is a semiconductor material selected from at least silicon, germanium, or silicon-germanium.

10. The method of claim 1, wherein the implantation comprises co-implanting two different ion species.

11. The method of claim 1 wherein the cooling gas enters the recess through an inlet orifice centrally located in the platen and diffuses peripherally.

12. The method of claim 1 wherein the cooling gas enters the recess through a plurality of inlet orifices annularly distributed about the peripheral of the platen and diffuses centrally.

13. The method of claim 1 wherein the gasket is partially permeable to the cooling gas, and wherein the cooling gas escapes through the partially permeable gasket.

14. The method of claim 1, which further comprises, during the implanting:

measuring the ion beam current; and adjusting the ion beam power in dependence on the measured beam current to be less than a limiting power value, the limiting power value being selected to limit the donor substrate temperature to be below a certain mean temperature.

* * * * *

UNITED STATES PATENT AND TRADEMARK OFFICE
CERTIFICATE OF CORRECTION

PATENT NO. : 8,247,309 B2  Page 1 of 1
APPLICATION NO. : 12/599680
DATED : August 21, 2012
INVENTOR(S) : Cattet et al.

It is certified that error appears in the above-identified patent and that said Letters Patent is hereby corrected as shown below:

Column 8:
Line 55 (claim 5, line 2), after "diffused", delete "towards".

Signed and Sealed this
Second Day of October, 2012

David J. Kappos
*Director of the United States Patent and Trademark Office*